(12) United States Patent
Matsubara

(10) Patent No.: US 8,373,914 B2
(45) Date of Patent: Feb. 12, 2013

(54) COMPUTER GENERATED HOLOGRAM INCLUDING PLURAL ISOTROPIC AND ANISOTROPIC CELLS FOR FORMING COMBINED INTENSITY DISTRIBUTION, GENERATION METHOD, AND EXPOSURE APPARATUS

(75) Inventor: Isao Matsubara, Tucson, AZ (US)

(73) Assignee: Canon Kabushiki Kaisha, Tokyo (JP)

( * ) Notice: Subject to any disclaimer, the term of this patent is extended or adjusted under 35 U.S.C. 154(b) by 490 days.

(21) Appl. No.: 12/681,895

(22) PCT Filed: Dec. 8, 2008

(86) PCT No.: PCT/JP2008/072723
§ 371 (c)(1),
(2), (4) Date: Apr. 7, 2010

(87) PCT Pub. No.: WO2009/084409
PCT Pub. Date: Jul. 9, 2009

(65) Prior Publication Data
US 2010/0208315 A1    Aug. 19, 2010

(30) Foreign Application Priority Data

Dec. 28, 2007   (JP) .................................. 2007-341123

(51) Int. Cl.
*G03H 1/08* (2006.01)
(52) U.S. Cl. ............ 359/9; 359/15; 359/489.06; 355/71
(58) Field of Classification Search ........................ None
See application file for complete search history.

(56) References Cited

U.S. PATENT DOCUMENTS 6,424,436 B1   7/2002   Yamanaka
(Continued)

FOREIGN PATENT DOCUMENTS

JP       6-53120 A    2/1994
JP    2004-111678 A    4/2004
(Continued)

OTHER PUBLICATIONS

Yu, Wanji, et al., "Polarization-multiplexed diffractive optical elements fabricated by subwavelength structures," Applied Optics, Jan. 1, 2002, vol. 41, No. 1, pp. 96-100.

(Continued)

*Primary Examiner* — Arnel C Lavarias
(74) *Attorney, Agent, or Firm* — Fitzpatrick, Cella, Harper & Scinto

(57) ABSTRACT

A computer generated hologram which forms a light intensity distribution on a predetermined plane by giving a phase distribution to a wavefront of incident light, the hologram comprising a plurality of anisotropic cells each including an anisotropic medium configured to change a polarization state of the incident light, and a plurality of isotropic cells each including an isotropic medium configured not to change a polarization state of the incident light, wherein a linearly polarized light component, in a first direction, of the incident light forms a first light intensity distribution on the predetermined plane, and a linearly polarized light component, in a second direction perpendicular to the first direction, of the incident light forms a second light intensity distribution different from the first light intensity distribution on the predetermined plane.

10 Claims, 13 Drawing Sheets

U.S. PATENT DOCUMENTS

| | | | |
|---|---|---|---|
| 7,599,069 B2 * | 10/2009 | Toussaint et al. | 356/491 |
| 2004/0057036 A1 | 3/2004 | Kawashima et al. | |
| 2005/0195480 A1 * | 9/2005 | Brown et al. | 359/494 |
| 2005/0219498 A1 | 10/2005 | Mori | |
| 2005/0280794 A1 | 12/2005 | Tsuji | |
| 2006/0028957 A1 | 2/2006 | Kim | |
| 2009/0034036 A1 | 2/2009 | Matsubara | |
| 2010/0328742 A1 * | 12/2010 | Matsubara et al. | 359/9 |

FOREIGN PATENT DOCUMENTS

| | | | |
|---|---|---|---|
| JP | 2005-294706 A | 10/2005 | |
| JP | 2006-5319 A | 1/2006 | |
| JP | 2006-49902 A | 2/2006 | |
| JP | 2006-196715 A | 7/2006 | |
| JP | 2009-36916 A | 2/2009 | |

OTHER PUBLICATIONS

European Patent Office, Extended European Search Report, Apr. 20, 2011 (issued in counterpart European patent application No. 08866265.5-2205).

Michael A. Seldowitz, et al., "Synthesis of digital holograms by direct binary search", Applied Optics, vol. 26, No. 14, Jul. 15, 1987, pp. 2788-2798.

Mar. 24, 2009 International Search Report in International Patent Appln. PCT/JP2008/072723.

Yoshinoro Oshita, et al., "Verification of Spatio-temporal profile of OTDM/WDM signals after Time -to- Two-Dimensional-Space Conversion System by Using CCD Camera with Ultra-Short Shutter," (2003), pp. 1548-1549.

Office Action issued in Taiwanese Patent Office Application No. 097150077, dated May 11, 2012.

\* cited by examiner

COMPUTER GENERATED HOLOGRAM INCLUDING PLURAL ISOTROPIC AND ANISOTROPIC CELLS FOR FORMING COMBINED INTENSITY DISTRIBUTION, GENERATION METHOD, AND EXPOSURE APPARATUS

TECHNICAL FIELD

The present invention relates to a computer generated hologram, a generation method, and an exposure apparatus.

BACKGROUND ART

A projection exposure apparatus has conventionally been employed to fabricate a micropatterned semiconductor device such as a semiconductor memory or logic circuit by using photolithography (printing). The projection exposure apparatus projects and transfers a circuit pattern formed on a reticle (mask) onto a substrate such as a wafer via a projection optical system.

A resolution R of the projection exposure apparatus is given by:

$$R = k_1 \times \frac{\lambda}{NA} \qquad (1)$$

where $\lambda$ is the exposure light wavelength, NA is the numerical aperture of the projection optical system, and $k_1$ is a process constant determined by, for example, a development process.

The shorter the exposure light wavelength or the higher the NA of the projection optical system, the better the resolution. However, it is difficult to further shorten the current exposure light wavelength because the transmittance of a general glass material decreases as the exposure light wavelength shortens. It is also difficult to further increase the NA of the projection optical system available at present because the depth of focus decreases in inverse proportion to the second power of the NA of the projection optical system, and because it is hard to design and manufacture lenses to form a high-NA projection optical system.

Under the circumstances, there have been proposed resolution enhanced technologies (RETs) of improving the resolution by decreasing the process constant $k_1$. One of these RETs is the so-called modified illumination method (or oblique illumination method).

The modified illumination method generally inserts an aperture stop, which has a light-shielding plate on the optical axis of an optical system, in the vicinity of the exit surface of an optical integrator which forms a uniform surface light source, thereby obliquely irradiating a reticle with exposure light. The modified illumination method includes, for example, an annular illumination method and quadrupole illumination method that are different in the aperture shape of an aperture stop (i.e., the shape of the light intensity distribution). There has also been proposed another modified illumination method which uses a computer generated hologram (CGH) in place of an aperture stop, in order to improve the use efficiency (illumination efficiency) of the exposure light.

Along with an increase in the NA of the projection optical system, a polarized illumination method which controls the polarization state of exposure light is also becoming necessary to increase the resolution of the projection exposure apparatus. The polarized illumination method basically illuminates a reticle with not P-polarized light but S-polarized light alone, which has a component in the circumferential direction of concentric circles about the optical axis.

In recent years, there has been proposed a technique which exploits both the modified illumination method (the formation of a light intensity distribution having a desired shape (for example, a quadrupolar shape)) and the polarized illumination method (polarization state control).

For example, Japanese Patent Laid-Open No. 2006-196715 discloses a technique which implements both the modified illumination method and polarized illumination method using one element. Japanese Patent Laid-Open No. 2006-196715 controls the shape (reproduced image) of the light intensity distribution using a CGH, and controls the polarization state using form birefringence. More specifically, this technique forms one CGH by parallelly arranging a plurality of CGHs (to be referred to as "sub-CGHs" hereinafter) corresponding to light beams in the same polarization direction, and applies form birefringence corresponding to the polarization direction to each sub-CGH.

Japanese Patent Laid-Open No. 2006-49902 selectively uses a desired polarization mode by adopting a polarization controller as a unit for controlling polarization modes applied to a sub-CGH.

Japanese Patent Laid-Open No. 2006-5319 discloses a technique which can control the balance among four poles of a quadrupolar light intensity distribution typically formed by the modified illumination method and polarized illumination method. More specifically, Japanese Patent Laid-Open No. 2006-5319 forms sub-CGHs by dividing a CGH into four, and changes the intensity distribution of the incident light, thereby making it possible to change the pole balance of the reproduced image obtained by the CGH.

A technique associated with the design of a CGH has also been proposed in "Synthesis of digital holograms by direct binary search", APPLIED OPTICS, Vol. 26, No. 14, July 1987, 2788-2798.

However, because the prior arts require sub CGHs of types in a number equal to that of polarization directions of a reproduced image (target image) formed by a CGH, it is very difficult for them to form a target image whose polarization direction changes continuously.

Furthermore, when sub-CGHs are formed by dividing one CGH into a plurality of CGHs, an illuminance variation occurs in the reproduced image if the optical integrator cannot sufficiently correct the intensity distribution of the incident light (for example, if the light impinges on only some of these CGHs).

When a plurality of sub-CGHs are combined, unnecessary diffracted light is generated due to structural discontinuity that occurs at the boundary between the sub-CGHs, resulting in deterioration in the reproduced image obtained by the CGH. The structural discontinuity that occurs at the boundary between the sub-CGHs can be eliminated by improving the design of a computer generated hologram, but this poses another problem that the design cost increases enormously.

When the polarization modes are selectively used by the polarization controller, the use efficiency (illumination efficiency) of the exposure light decreases significantly (i.e., a loss in light amount increases).

DISCLOSURE OF INVENTION

The present invention provides a computer generated hologram which can suppress an illuminance variation and a loss in light amount and form a light intensity distribution (e.g., a reproduced image whose polarization direction changes continuously) with a desired shape and polarization state.

According to one aspect of the present invention, there is provided a computer generated hologram which forms a light intensity distribution on a predetermined plane by giving a phase distribution to a wavefront of incident light, the hologram comprising a plurality of anisotropic cells each including an anisotropic medium configured to change a polarization state of the incident light, and a plurality of isotropic cells each including an isotropic medium configured not to change a polarization state of the incident light, wherein a linearly polarized light component, in a first direction, of the incident light forms a first light intensity distribution on the predetermined plane, a linearly polarized light component, in a second direction perpendicular to the first direction, of the incident light forms a second light intensity distribution different from the first light intensity distribution on the predetermined plane, and dimensions and arrangements of the plurality of anisotropic cells and the plurality of isotropic cells are set such that the linearly polarized light component in the first direction is in phase with or π out of phase from the linearly polarized light component in the second direction in a region in which the first light intensity distribution and the second light intensity distribution are superposed on each other.

According to another aspect of the present invention, there is provided a generation method of generating data to manufacture a computer generated hologram which forms a light intensity distribution on a predetermined plane by giving a phase distribution to a wavefront of incident light, the method comprising a first determination step of dividing a light intensity distribution to be formed on the predetermined plane into a first light intensity distribution including a linearly polarized light component in a first direction, and a second light intensity distribution including a linearly polarized light in a second direction perpendicular to the first direction, thereby determining shapes of the first light intensity distribution and the second light intensity distribution, a second determination step of determining phases of the first light intensity distribution and the second light intensity distribution in accordance with a relationship between a polarization direction of the incident light and a polarization direction of the light intensity distribution to be formed on the predetermined plane, a generation step of generating first data which specifies a computer generated hologram which forms the first light intensity distribution having the shape determined in the first determination step and the phase determined in the second determination step, and second data which specifies a computer generated hologram which forms the second light intensity distribution having the shape determined in the first determination step and the phase determined in the second determination step, and an integration step of integrating the first data and the second data generated in the generation step.

According to still another aspect of the present invention, there is provided an exposure apparatus comprising an illumination optical system configured to illuminate a reticle with light from a light source, and a projection optical system configured to project a pattern of the reticle onto a substrate, the illumination optical system including a computer generated hologram, wherein the computer generated hologram forms a light intensity distribution on a predetermined plane by giving a phase distribution to a wavefront of incident light, the computer generated hologram includes a plurality of anisotropic cells each including an anisotropic medium configured to change a polarization state of the incident light, and a plurality of isotropic cells each including an isotropic medium configured not to change a polarization state of the incident light, a linearly polarized light component, in a first direction, of the incident light forms a first light intensity distribution on the predetermined plane, a linearly polarized light component, in a second direction perpendicular to the first direction, of the incident light forms a second light intensity distribution different from the first light intensity distribution on the predetermined plane, and dimensions and arrangements of the plurality of anisotropic cells and the plurality of isotropic cells are set such that the linearly polarized light component in the first direction is in phase with or π out of phase from the linearly polarized light component in the second direction in a region in which the first light intensity distribution and the second light intensity distribution are superposed on each other.

Further features of the present invention will become apparent from the following description of exemplary embodiments with reference to the attached drawings.

BEST MODE FOR CARRYING OUT THE INVENTION

Figure 1:
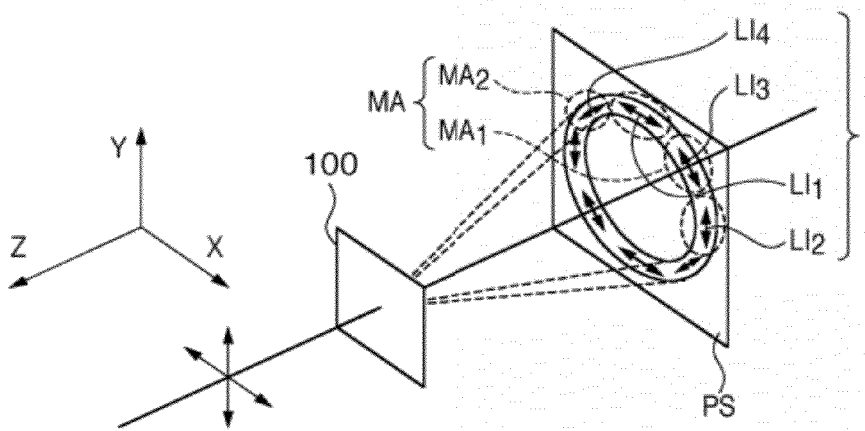
FIG. 1 is a view for explaining a computer generated hologram according to one aspect of the present invention.

A preferred embodiment of the present invention will be described below with reference to the accompanying drawings. The same reference numerals denote the same members throughout the drawings, and a repetitive description thereof will not be given.

FIG. 1 is a view for explaining a computer generated hologram 100 according to one aspect of the present invention. As shown in FIG. 1, the computer generated hologram 100 forms a light intensity distribution (reproduced image) LI on a predetermined plane PS (for example, at the aperture position) by giving a phase distribution to the wavefront of the incident light. The computer generated hologram 100 gives different phase distributions to the wavefront of X-polarized light serving as linearly polarized light in a first direction (linearly polarized light whose polarization direction is the X-axis direction), and that of Y-polarized light serving as linearly polarized light in a second direction (linearly polarized light whose polarization direction is the Y-axis direction). With this operation, X-polarized light (a linearly polarized light component in the first direction of the incident light) forms a first light intensity distribution $LI_1$, and Y-polarized light (a linearly polarized light component in the second direction of the incident light) forms a second light intensity distribution $LI_2$ different from the first light intensity distribution $LI_1$. Note that the polarization directions of the X-polarized light and Y-polarized light are orthogonal to each other.

The computer generated hologram 100 is set such that the X-polarized light component is in phase with or $\pi$ out of phase from the Y-polarized light component in regions MA, in which the first light intensity distribution $LI_1$ and the second light intensity distribution $LI_2$ are superposed on each other, on the predetermined plane PS. With this setting, when the incident light on the computer generated hologram 100 is linearly polarized light including X-polarized light and Y-polarized light, the computer generated hologram 100 can form light intensity distributions $LI_3$ and $LI_4$ by linearly polarized light beams having polarization directions different from those of the X-polarized light and Y-polarized light in the regions MA on the predetermined plane PS. The regions MA in which the first light intensity distribution $LI_1$ and the second light intensity distribution $LI_2$ are superposed on each other are those in which light intensity distributions (reproduced images) having polarization directions different from those of the X-polarized light and Y-polarized light are formed as the design targets of the computer generated hologram 100. In other words, the regions MA in which the first light intensity distribution $LI_1$ and the second light intensity distribution $LI_2$ are superposed on each other are not regions in which any minute light intensity distributions generated due to manufacturing errors of the computer generated hologram 100 or insufficient correction in designing the computer generated hologram 100 are formed.

Figure 2:
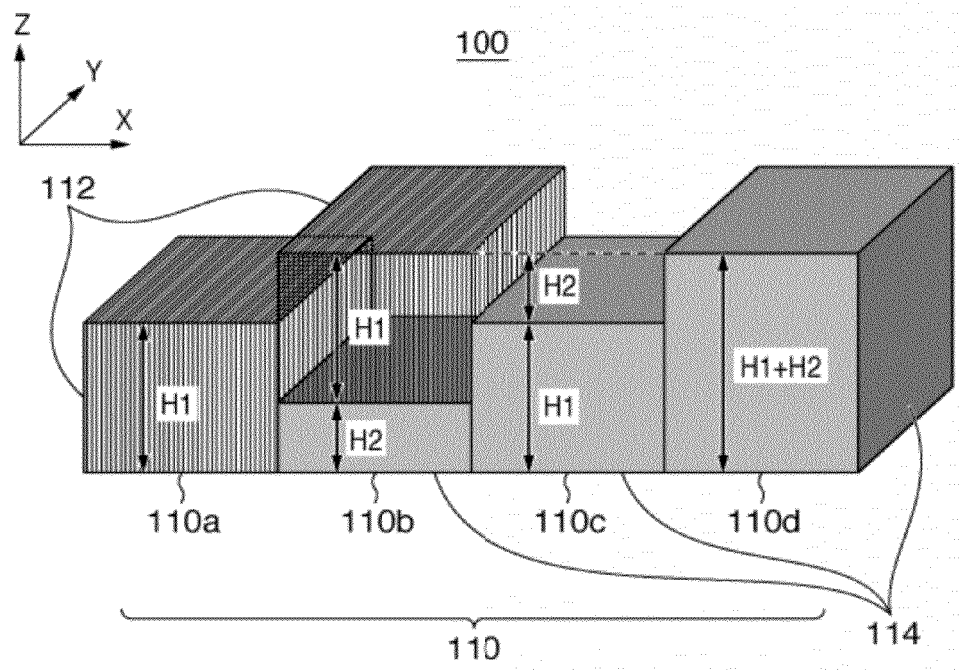
FIG. 2 is a schematic perspective view showing a cell structure which forms the computer generated hologram shown in FIG. 1.

The computer generated hologram 100 which gives different phase distributions to the wavefronts of X-polarized light and Y-polarized light will be explained in detail below. FIG. 2 is a schematic perspective view showing a cell structure which forms the computer generated hologram 100. As shown in FIG. 2, the computer generated hologram 100 includes a plurality of rectangular cells 110. As will be described later, the dimensions and arrangements of the plurality of cells 110 are set such that the X-polarized light is in phase with or $\pi$ out of phase from the Y-polarized light in each region MA in which the first light intensity distribution $LI_1$ and the second light intensity distribution $LI_2$ are superposed on each other.

To give different phase distributions to the wavefronts of X-polarized light and Y-polarized light, the computer generated hologram 100 must independently control the wavefronts in the respective polarization directions. For example, if the computer generated hologram 100 has two steps, it is necessary to give binary phases to the wavefronts in the two polarization directions. For this purpose, the cells 110 of the computer generated hologram 100 must have cell structures of four types. Each of cells 110a to 110d shown in FIG. 2 has a cell structure of one of these four types. The computer generated hologram 100 is formed by arraying cells 110 of four types in a tetragonal lattice pattern.

As shown in FIG. 2, the plurality of cells 110 include anisotropic media 112 which change the polarization state of the incident light, and isotropic media 114 which do not change the polarization state of the incident light. More specifically, the cell 110a includes an anisotropic medium 112 alone, the cell 110b includes an anisotropic medium 112 and isotropic medium 114, and each of the cells 110c and 110d includes an isotropic medium 114 alone. That the isotropic media 114 do not change the polarization state of the incident light means herein that they do not change the polarization state of the incident light compared to the anisotropic media 112. For this reason, this embodiment assumes that a medium in which the difference between their refractive indices with respect to X-polarized light and Y-polarized light is 0 (inclusive) to 0.001 (inclusive) is an isotropic medium.

The steps among the cells 110a to 110d in the Z direction can be represented by using a refractive index n of the isotropic medium 114, a refractive index $n_x$ of the anisotropic medium 112 with respect to X-polarized light, and a refractive index $n_y$ of the anisotropic medium 112 with respect to Y-polarized light. This embodiment exemplifies a case in which $n=n_x>n_y$.

To configure a two-step computer generated hologram 100, a phase shift of π is necessary. To attain this state, thicknesses $H_1$ of the anisotropic medium 112 of the cell 110a and the isotropic medium 114 of the cell 110c need only satisfy:

$$H_1 = \frac{1}{2}\frac{\lambda}{n_x - n_y} = \frac{1}{2}\frac{\lambda}{n - n_y} \quad (2)$$

A thickness $H_2$ of the isotropic medium 114 of the cell 110b, that is, a difference $H_2$ between the thickness of the cell 110c and that of the cell 110b or 110d (a difference $H_2$ between the thickness of the isotropic medium 114 of the cell 110c and that of the isotropic medium 114 of the cell 110d) need only satisfy:

$$H_2 = \frac{1}{2}\frac{\lambda}{n-1} \quad (3)$$

Assuming X-polarized light which impinges on the cell 110c as a reference, X-polarized light which impinges on the cell 110a is in phase with the reference. Also, assuming Y-polarized light which impinges on the cell 110c as a reference, Y-polarized light which impinges on the cell 110a is π out of phase from the reference.

Assuming X-polarized light which impinges on the cell 110c as a reference, X-polarized light which impinges on the cell 110b is π out of phase from the reference. Also, assuming Y-polarized light which impinges on the cell 110c as a reference, Y-polarized light which impinges on the cell 110b is in phase with the reference.

Assuming X-polarized light which impinges on the cell 110c as a reference, X-polarized light which impinges on the cell 110d is π out of phase from the reference. Also, assuming Y-polarized light which impinges on the cell 110c as a reference, Y-polarized light which impinges on the cell 110d is π out of phase from the reference.

In this manner, the computer generated hologram 100 can give binary phases to the wavefronts in the two polarization directions by the cell structures of four types (cells 110a to 110d) shown in FIG. 2. In other words, the cell structures of four types shown in FIG. 2 exemplify four combinations of phases given to the wavefronts of the X-polarized light and Y-polarized light, that is, (0, π), (π, 0), (0, 0), and (π, π).

A case in which $n_x=n=1.6$ and $n_y=1.4$ will be exemplified as a concrete numerical example. In this case, letting λ be the wavelength of the incident light, the thicknesses $H_1$ and $H_2$ are 2.5λ and 0.833λ, respectively, that fall within few multiples of the wavelength λ. These values are realistic as the thicknesses of the cells of a computer generated hologram.

Figure 3:
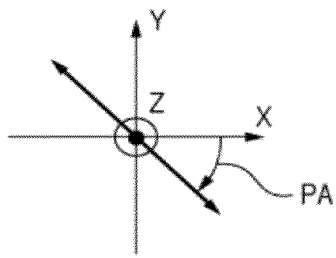
FIG. 3 is a diagram showing linearly polarized light in which an angle PA of the polarization direction with respect to the X-axis is −45°.

FIG. 3 is a diagram showing linearly polarized light in which an angle PA of the polarization direction with respect to the X-axis is −45°. When the linearly polarized light shown in FIG. 3 impinges on the computer generated hologram 100, the regions MA in which the first light intensity distribution $LI_1$ and the second light intensity distribution $LI_2$ are superposed on each other include two phase regions. These two phase regions are a same phase region $MA_1$ in which X-polarized light (a linearly polarized light component in the first direction of the incident light) is in phase with Y-polarized light (a linearly polarized light component in the second direction of the incident light), and a reverse phase region $MA_2$ in which X-polarized light is π out of phase from Y-polarized light. As shown in FIG. 1, the polarization direction of linearly polarized light which forms a light intensity distribution $LI_3$ in the same phase region $MA_1$ is different from that of linearly polarized light which forms a light intensity distribution $LI_4$ in the reverse phase region $MA_2$.

Figure 4:
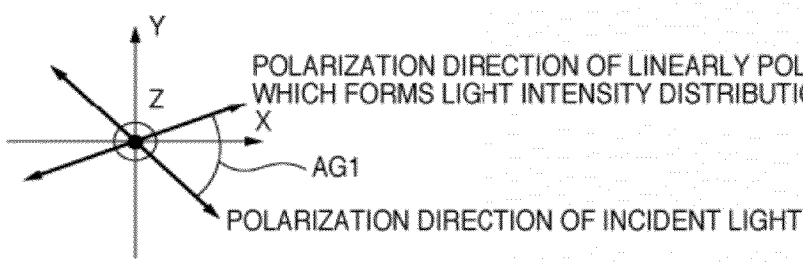
FIG. 4 is a diagram showing the relationship between the polarization direction of the incident light and that of linearly polarized light which forms a light intensity distribution in a same phase region.

More specifically, the X-polarized light is set to be in phase with the Y-polarized light in the same phase region $MA_1$ so that the polarization direction of the incident light becomes the same as that of linearly polarized light which forms a light intensity distribution $LI_3$ in the same phase region $MA_1$. In other words, the X-axis (first direction) and the Y-axis (second direction) are set to fall outside an angle (acute angle) $AG_1$ formed by the polarization direction of the incident light and that of linearly polarized light which forms a light intensity distribution $LI_3$ in the same phase region $MA_1$, as shown in FIG. 4. In this case, when, for example, the incident light is linearly polarized light in which the angle of the polarization direction with respect to the X-axis is −45° (see FIG. 3), the angle of the polarization direction of linearly polarized light which forms a light intensity distribution $LI_3$ in the same phase region $MA_1$ with respect to the X-axis is −90° (exclusive) to 0° (exclusive). Note that FIG. 4 is a diagram showing the relationship between the polarization direction of the incident light and that of linearly polarized light which forms a light intensity distribution $LI_3$ in the same phase region $MA_1$.

Figure 5:
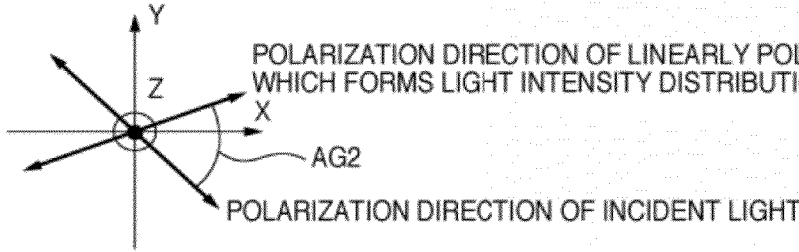
FIG. 5 is a diagram showing the relationship between the polarization direction of the incident light and that of linearly polarized light which forms a light intensity distribution in a reverse phase region.

Also, the X-polarized light is set to be π out of phase from the Y-polarized light in the reverse phase region $MA_2$ so that the polarization direction of the incident light becomes perpendicular to that of linearly polarized light which forms a light intensity distribution $LI_4$ in the reverse phase region $MA_2$. In other words, the X-axis (first direction) and the Y-axis (second direction) are set to fall within an angle (acute angle) $AG_2$ formed by the polarization direction of the incident light and that of linearly polarized light which forms a light intensity distribution $LI_4$ in the reverse phase region $MA_2$, as shown in FIG. 5. In this case, when, for example, the incident light is linearly polarized light in which the angle of the polarization direction with respect to the X-axis is −45° (see FIG. 3), the angle of the polarization direction of linearly polarized light which forms a light intensity distribution $LI_4$ in the reverse phase region $MA_2$ with respect to the X-axis is 0° (exclusive) to 90° (exclusive). Note that FIG. 5 is a diagram showing the relationship between the polarization direction of the incident light and that of linearly polarized light which forms a light intensity distribution $LI_4$ in the reverse phase region $MA_2$.

Because the angle of the polarization direction of linearly polarized light in each region MA in which the first light intensity distribution $LI_1$ and the second light intensity distribution $LI_2$ are superposed on each other is determined by the ratio between the amplitudes of X-polarized light and the Y-polarized light, light including X-polarized light and Y-polarized having the same amplitude need only impinge on the computer generated hologram 100. More specifically, the incident light need only be linearly polarized light such as that in which the angle PA of the polarization direction with respect to the X-axis is −45° as shown in FIG. 3.

In this embodiment, the incident light is linearly polarized light including X-polarized light and Y-polarized light having the same amplitude assuming a case in which the computer generated hologram 100 forms a light intensity distribution including X-polarized light and Y-polarized light at the same ratio as in annular illumination. However, a computer generated hologram can be designed to be compatible with the formation of a light intensity distribution including X-polarized light and Y-polarized light at different ratios by using polarized light including X-polarized light and Y-polarized light having different amplitudes as the incident light in order to obtain high efficiency. Although the incident light can also be circularly polarized light, it is necessary to change the thickness of each cell of the computer generated hologram 100 in that case.

In one example, the anisotropic media 112 of all cells may have identical optic axis directions. If the anisotropic media 112 of all the cells shown in FIG. 2 have identical optic axis directions, at least one cell (the cell 110$b$ in this embodiment) includes an anisotropic medium 112 formed by an anisotropic layer, and an isotropic medium 114 formed by an isotropic layer. The optic axis means herein an axis along a direction in which, because the refractive index is constant in the anisotropic medium 112, no birefringence occurs even if non-polarized light impinges on the anisotropic cell so that ordinary and extraordinary rays match each other or have a minimum deviation if any.

Figure 6:
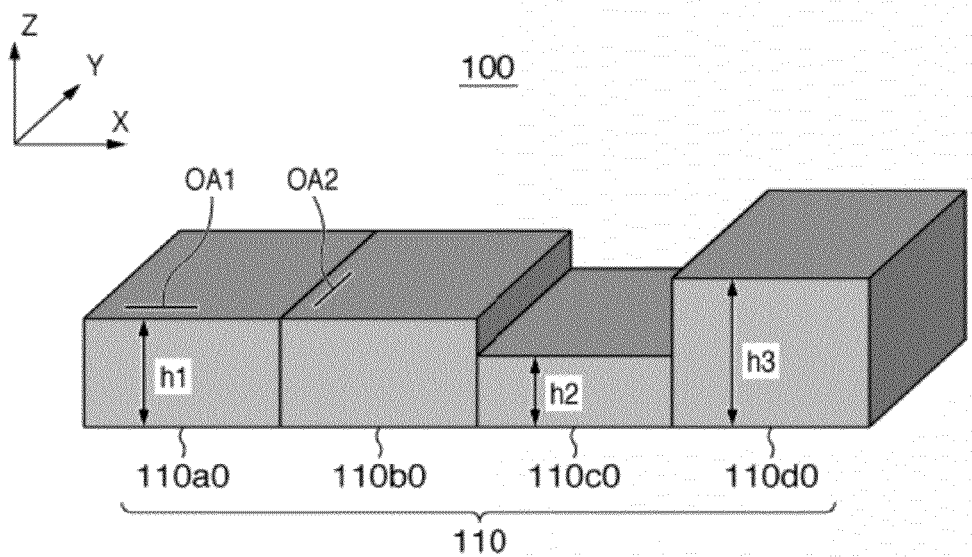
FIG. 6 is a schematic perspective view showing a cell structure which forms a computer generated hologram including anisotropic cells.

In another example, the anisotropic media 112 of respective cells may have different optic axis directions. FIG. 6 is a schematic perspective view showing a cell structure which forms a computer generated hologram 100 including anisotropic cells. If the cells of the computer generated hologram 100 do not have identical optic axis directions, that is, the optic axis direction of each cell is selected freely, each of the cells of four types can be formed from an anisotropic medium 112 or isotropic medium 114 alone. In this case, the computer generated hologram 100 includes a first anisotropic cell 110$a$0, second anisotropic cell 110$b$0, first isotropic cell 110$c$0, and second isotropic cell 110$d$0, as shown in FIG. 6. The first anisotropic cell 110$a$0 and second anisotropic cell 110$b$0 are made of, for example, birefringent materials. The direction of an optic axis $OA_1$ of the first anisotropic cell 110$a$0 is different from that of an optic axis $OA_2$ of the second anisotropic cell 110$b$0, and, for example, they intersect at right angles with each other, as shown in FIG. 6.

Note that a function of setting light components in two polarization directions of, the incident light to be in phase with or π out of phase from each other in the cells 110$a$0 to 110$d$0 of four types of the computer generated hologram 100 shown in FIG. 6 is the same as in the cells 110$a$ to 110$d$ of four types of the computer generated hologram 100 shown in FIG. 2.

Thicknesses (the thicknesses in the Z direction) $h_1$ of the first anisotropic cell 110$a$0 and second anisotropic cell 110$b$0, a thickness $h_2$ of the first isotropic cell 110$c$0, and a thickness $h_3$ of the second isotropic cell 110$d$0 can be represented by using the following three refractive indices (first to third refractive indices). The first refractive indices are a refractive index $n_E$ of the first anisotropic cell 110$a$0 with respect to X-polarized light, and a refractive index $n_E$ of the second anisotropic cell 110$b$0 with respect to Y-polarized light. The second refractive indices are a refractive index $n_O$ of the first anisotropic cell 110$a$0 with respect to Y-polarized light, and a refractive index $n_O$ of the second anisotropic cell 110$b$0 with respect to X-polarized light. The third refractive indices are refractive indices $n$ of the first isotropic cell 110$c$ and second isotropic cell 110$d$. This embodiment exemplifies a case in which $n_O > n_E$.

To configure a two-step computer generated hologram 100, a phase shift of π is necessary. To attain this state, the thicknesses $h_1$ of the first anisotropic cell 110$a$0 and second anisotropic cell 110$b$0 need only satisfy:

$$h_1 = \frac{1}{2}\frac{\lambda}{n_O - n_E} \quad (4)$$

To form a wavefront matching the one obtained at the refractive index $n_O$ of the first anisotropic cell 110$a$0 with respect to Y-polarized light and the refractive index $n_O$ of the second anisotropic cell 110$b$0 with respect to X-polarized light, the thickness $h_2$ of the first isotropic cell 110$c$0 need only satisfy:

$$h_2 = \frac{n_O - 1}{n - 1} h_1 \quad (5)$$

Also, to form a wavefront matching the one obtained at the refractive index $n_E$ of the first anisotropic cell 110$a$0 with respect to X-polarized light and the refractive index $n_E$ of the second anisotropic cell 110$b$0 with respect to Y-polarized light, the thickness $h_3$ of the second isotropic cell 110$d$0 need only satisfy:

$$h_3 = \frac{n_E - 1}{n - 1} h_1 \quad (6)$$

A case in which $n_O$=1.6, $n_E$=1.4, and n=1.5 will be exemplified as a concrete numerical example. In this case, letting λ be the wavelength of the incident light, the thicknesses $h_1$, $h_2$, and $h_3$ are 2.5λ, 2λ, and 3λ, respectively, that fall within few multiples of the wavelength λ. These values are realistic as the thicknesses of the cells of a computer generated hologram.

Figure 7:
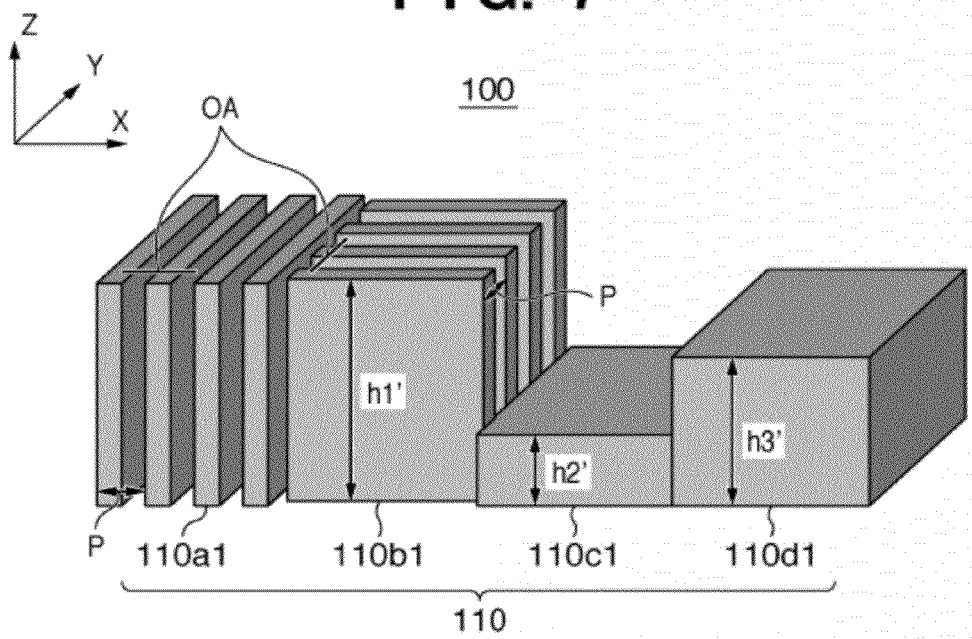
FIG. 7 is a schematic perspective view showing a cell structure which forms a computer generated hologram including anisotropic cells having a three-dimensional structure which generates form birefringence.

Each of the first anisotropic cell 110$a$0 and second anisotropic cell 110$b$0 may be formed from a diffraction grating (three-dimensional structure) which generates form birefringence. FIG. 7 is a schematic perspective view showing a cell structure which forms a computer generated hologram including anisotropic cells formed from diffraction gratings which generate form birefringence. The computer generated hologram 100 shown in FIG. 7 includes a first anisotropic cell 110$a$1, second anisotropic cell 110$b$1, first isotropic cell 110$c$1, and second isotropic cell 110$d$1.

Each of the first anisotropic cell 110$a$1 and second anisotropic cell 110$b$1 is formed from a diffraction grating which generates form birefringence, as described above. For example, each of the first anisotropic cell 110$a$1 and second anisotropic cell 110$b$1 is formed from a one-dimensional diffraction grating having a periodic structure with a pitch P smaller than the wavelength of the incident light in order to prevent the generation of diffracted light components of orders other than the 0th order.

The first anisotropic cell 110$a$1 and second anisotropic cell 110$b$1 are configured such that the direction of the pitch of the periodic structure of the first anisotropic cell 110$a$1 is different from that of the second anisotropic cell 110$b$1. This makes it possible to attain a cell which advances the wavefront of X-polarized light from that of Y-polarized light, and a cell which retards the wavefront of X-polarized light from that of Y-polarized light.

Japanese Patent Laid-Open No. 2006-196715 discloses a diffraction grating made of quartz as an example of the diffraction grating which generates form birefringence. According to Japanese Patent Laid-Open No. 2006-196715, when quartz has a refractive index of 1.56 with respect to a wavelength of 193 nm, and the duty ratio of the diffraction grating in the form birefringence region is 1:1 (=0.5), a refractive index $n_I$ of the diffraction grating in the direction of the pitch is 1.19, and a refractive index $n_{II}$ of the diffraction grating in a direction perpendicular to the pitch is 1.31.

Even when each anisotropic cell is formed from a diffraction grating which generates form birefringence, thicknesses $h_1'$ of the first anisotropic cell 110a1 and second anisotropic cell 110b1 need only satisfy equation (4) upon substituting $h_1'$ for $h_1$. Likewise, a thickness $h_2'$ of the first isotropic cell 110c1 need only satisfy equation (5) upon substituting $h_2'$ for $h_2$, and a thickness $h_3'$ of the second isotropic cell 110d1 need only satisfy equation (6) upon substituting $h_3'$ for $h_3$.

A case in which the first anisotropic cell 110a1 and second anisotropic cell 110b1 are made of quartz compatible with a wavelength $\lambda=193$ nm will be exemplified as a concrete numerical example. The refractive index of the quartz is assumed to be 1.56, a refractive index $n_I$ of the diffraction grating in the direction of the pitch is assumed to be 1.19, and a refractive index $n_{II}$ of the diffraction grating in a direction perpendicular to the pitch is assumed to be 1.31, as described above. To obtain the thicknesses $h_1'$ of the first anisotropic cell 110a1 and second anisotropic cell 110b1, the thickness $h_2'$ of the first isotropic cell 110c1, and the thickness $h_3'$ of the second isotropic cell 110d1 using equations (4) to (6), it is only necessary to substitute $n_I$ for $n_E$ and substitute $n_{II}$ for $n_O$. In this case, the thicknesses $h_1'$ of the first anisotropic cell 110a1 and second anisotropic cell 110b1 are $4.17\lambda$ from equation (4). This value is equal to the thickness of a $\lambda/2$ plate as one type of wave plates. From equations (5) and (6), the thickness $h_2'$ of the first isotropic cell 110c1 and the thickness $h_3'$ of the second isotropic cell 110d1 are $1.41\lambda$ and $2.31\lambda$, respectively, that are smaller than the thicknesses $h_1'$ of the first anisotropic cell 110a1 and second anisotropic cell 110b1. In this manner, the thicknesses $h_1'$ of the first anisotropic cell 110a1 and second anisotropic cell 110b1, the thickness $h_2'$ of the first isotropic cell 110c1, and the thickness $h_3'$ of the second isotropic cell 110d1 fall within the thickness of the $\lambda/2$ plate. $4.17\lambda$ is realistic as the thickness of the cell of a computer generated hologram.

This embodiment has exemplified a two-step computer generated hologram, so the computer generated hologram 100 is formed from anisotropic cells having one thickness and isotropic cells having two thicknesses. However, the present invention is not particularly limited to a two-step computer generated hologram, and is applicable to a computer generated hologram of a multiple of steps more than two steps which is formed from anisotropic cells having more than one thickness, and isotropic cells having more than two thicknesses. In this embodiment, the one-dimensional diffraction grating is used as the diffraction grating which generates form birefringence, and a two-dimensional diffraction grating may be used.

Note that although this embodiment has exemplified only the cell structure of the computer generated hologram 100, it is hard to bond materials having different properties, as shown in FIGS. 2, 6, and 7. Furthermore, if each anisotropic cell is formed from a diffraction grating which generates form birefringence, as shown in FIG. 7, the diffraction grating floats in the air, which is hard to maintain. In view of this, the above-described anisotropic cells and isotropic cells are formed on a substrate made of, for example, quartz in practice.

Figure 8:
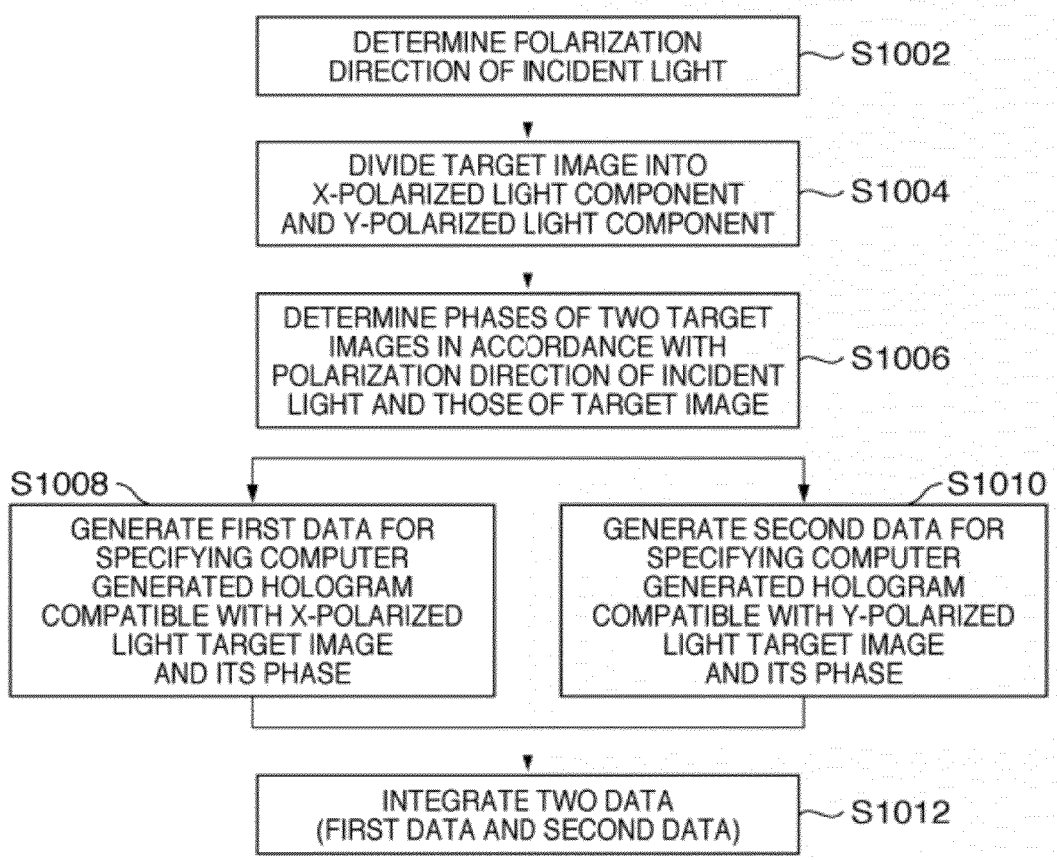
FIG. 8 is a flowchart for explaining a generation method of generating data to manufacture a computer generated hologram which forms a light intensity distribution including arbitrary polarization directions.

A detailed design example of the computer generated hologram 100 will be explained below. FIG. 8 is a flowchart for explaining a generation method of generating data to manufacture a computer generated hologram 100 which forms a light intensity distribution including arbitrary polarization directions.

Figure 9:
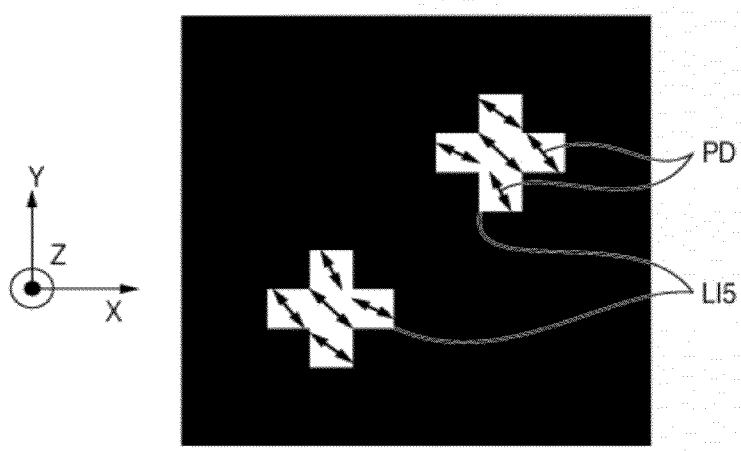
FIG. 9 is a view showing an example of a light intensity distribution (target image) formed by a computer generated hologram.

A design example of a computer generated hologram 100 which assumes a light intensity distribution $LI_5$ as shown in FIG. 9 as the target image will be explained. Polarization directions PD of the light intensity distribution $LI_5$ include a plurality of polarization directions, and match the circumferential direction of concentric circles (i.e., correspond to S-polarization) in each pixel. Note that FIG. 9 is a view showing an example of a light intensity distribution (target image) formed by a computer generated hologram 100.

Referring to FIG. 8, in step S1002, the polarization direction (polarization state) of light which impinges on the computer generated hologram 100 (incident light) is determined. In this embodiment, linearly polarized light in which the angle of the polarization direction with respect to the X-axis is $-45°$ (see FIG. 3) is determined as the incident light, as described above. Hence, the target image shown in FIG. 9 is the one in which X-polarized light is in phase with Y-polarized light.

In step S1004, the target image is divided into X-polarized light (X-polarized light component) and Y-polarized light (Y-polarized light component). In other words, the target image is divided into an X-polarized light target image and Y-polarized light target image to determine the shapes of the X-polarized light target image and Y-polarized light target image (first determination step). For example, the target image is divided in accordance with the intensity ratio between the X-polarized light and the Y-polarized light. Although the target image is divided into X-polarized light and Y-polarized light in this embodiment, it need only be divided in two orthogonal polarization directions. The two orthogonal polarization directions can also be interpreted as directions along which the inner product of the Jones vectors of the divided incident light beams is zero.

Figure 10A:
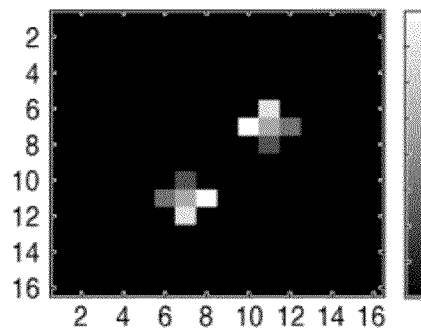
FIGS. 10A and 10B are charts showing the intensities of X-polarized light and Y-polarized light when the target image shown in FIG. 9 is divided into them.
Figure 10B:
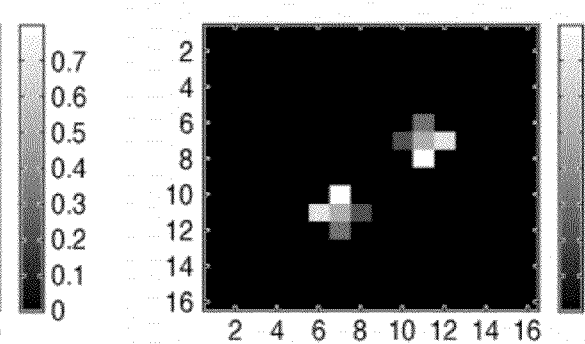
Figure 10B:
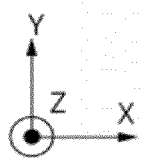

FIG. 10A shows, when the target image shown in FIG. 9 is divided into X-polarized light and Y-polarized light, the intensity (light intensity distribution) of the X-polarized light. FIG. 10B shows, when the target image shown in FIG. 9 is divided into X-polarized light and Y-polarized light, the intensity (light intensity distribution) of the Y-polarized light. If the target image includes only the X-polarized light intensity distribution and Y-polarized light intensity distribution, data to manufacture a computer generated hologram compatible with the light intensity distributions shown in FIGS. 10A and 10B need only be generated. Note that, because the target image shown in FIG. 9 is formed by a light intensity distribution $LI_5$ including both X-polarized light and Y-polarized light, it is necessary to take account of not only the intensity (amplitude) of the target image but also its phase.

In step S1006, the phases of the two target images divided in step S1004 are determined in accordance with the relationship between the polarization direction of the incident light (see FIG. 3) and those of the target image (see FIG. 9) (second determination step). In this embodiment, the angles of the polarization directions of the target image with respect to the X-axis are $-90°$ (exclusive) to $0°$ (exclusive). Hence, the target image shown in FIG. 9 is formed by a light intensity distribution $LI_5$ in a same phase region in which the polarization direction of the target image is the same as that of the incident light or the polarization directions of the X-polarized light and Y-polarized light fall outside an angle (acute angle) formed by the two polarization directions. To attain this configuration, the X-polarized light target image need only be set to be in phase with the Y-polarized light target image.

Figure 11A:
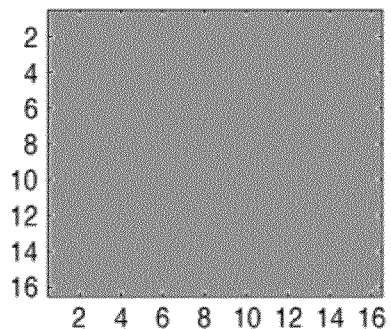
FIGS. 11A and 11B are charts showing an example of a combination of the phase of the X-polarized light target image shown in FIG. 10A and that of the Y-polarized light target image shown in FIG. 10B.
Figure 11B:
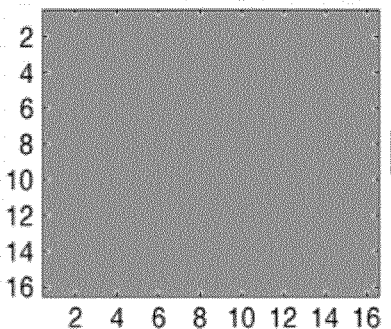
Figure 11B:
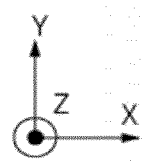

FIGS. 11A and 11B are charts showing an example of a combination of the phase of the X-polarized light target image shown in FIG. 10A and that of the Y-polarized light target image shown in FIG. 10B. Referring to FIGS. 11A and 11B, the phases of both the X-polarized light target image and Y-polarized light target image are set zero in this embodiment. This means not that the phases of the X-polarized light target image and Y-polarized light target image can be determined randomly but that the phases of both these target images are set to zero. FIGS. 11A and 11B merely show an example of a phase combination, which can be arbitrarily selected as long as the X-polarized light target image is in phase with the Y-polarized light target image in same phase regions.

In step S1008, first data which specifies a computer generated hologram compatible with the shape of the X-polarized light target image divided in step S1004 and the phase of the X-polarized light target image determined in step S1006 is generated. Likewise, in step S1010, second data which specifies a computer generated hologram compatible with the shape of the Y-polarized light target image divided in step S1004 and the phase of the Y-polarized light target image determined in step S1006 is generated.

If the target image includes phase information as in this embodiment, it is difficult to generate data for specifying a computer generated hologram (i.e., design a computer generated hologram) by the IFTA (Iterative Fourier Transform Algorithm). This is because the IFTA uses the phase of the target image as a means for enhancing its reproducibility.

In view of this, in this embodiment, a computer generated hologram compatible with the X-polarized light target image and its phase, and that compatible with the Y-polarized light target image and its phase are designed using the DBS (Direct Binary Search). The DBS is a method of repeating, for all cells of a computer generated hologram, a process of changing the phase of one cell of the computer generated hologram, and adopting the change if the value of a target image evaluation function has improved than before or canceling the change if it has deteriorated than before. The DBS is disclosed in "Synthesis of digital holograms by direct binary search", APPLIED OPTICS, Vol. 26, No. 14, 15 Jul. 1987, 2788-2798, and a detailed description thereof will not be given herein.

Nowadays, various methods such as simulated annealing have been proposed as improved versions of the DBS. In this embodiment, a simplest method, that is, the DBS is used for the sake of convenience of explanation of a concrete design example of the computer generated hologram 100. In practice, not only the DBS but also all design methods may be used as long as a computer generated hologram compatible with a target image including a phase can be designed.

Figure 12A:
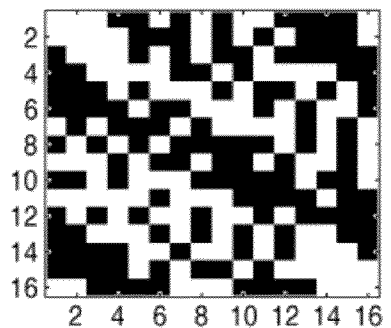
FIGS. 12A and 12B are charts showing the phase distribution of a computer generated hologram designed to be compatible with the X-polarized light target image and its phase, and that of a computer generated hologram designed to be compatible with the Y-polarized light target image and its phase.
Figure 12B:
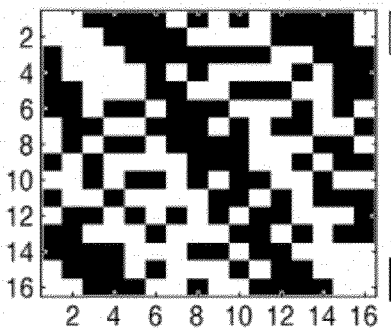
Figure 12B:
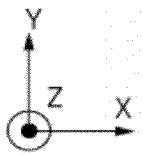

FIG. 12A is a chart showing the phase distribution (first data) of a computer generated hologram designed to be compatible with the X-polarized light target image (FIG. 10A) and its phase (FIG. 11A). FIG. 12B is a chart showing the phase distribution (second data) of a computer generated hologram designed to be compatible with the Y-polarized light target image (FIG. 10B) and its phase (FIG. 11B).

In step S1012, the first data (FIG. 12A) generated in step S1008 and the second data (FIG. 12B) generated in step S1010 are integrated.

There are four combinations of the phases of the X-polarized light and Y-polarized light in the computer generated hologram, that is, (0, π), (π, 0), (0, 0), and (π, π). The cell structure shown in FIG. 2, 6, or 7 can be used for a computer generated hologram compatible with these four phase combinations. In other words, a computer generated hologram which forms the target image shown in FIG. 9 has the cell structure shown in FIG. 2, 6, or 7.

The cell structure of a computer generated hologram compatible with four phase combinations will be shown in detail. For example, if the combination of the phases of the X-polarized light and Y-polarized light is (0, π), the cell 110$a$ shown in FIG. 2, the cell 110$a$0 shown in FIG. 6, or the cell 110$a$1 shown in FIG. 7 is adopted. If the combination of the phases of the X-polarized light and Y-polarized light is (π, 0), the cell 110$b$ shown in FIG. 2, the cell 110$b$0 shown in FIG. 6, or the cell 110$b$1 shown in FIG. 7 is adopted. If the combination of the phases of the X-polarized light and Y-polarized light is (0, 0), the cell 110$c$ shown in FIG. 2, the cell 110$c$0 shown in FIG. 6, or the cell 110$c$1 shown in FIG. 7 is adopted. If the combination of the phases of the X-polarized light and Y-polarized light is (π, π), the cell 110$d$ shown in FIG. 2, the cell 110$d$0 shown in FIG. 6, or the cell 110$d$1 shown in FIG. 7 is adopted.

Figure 13:
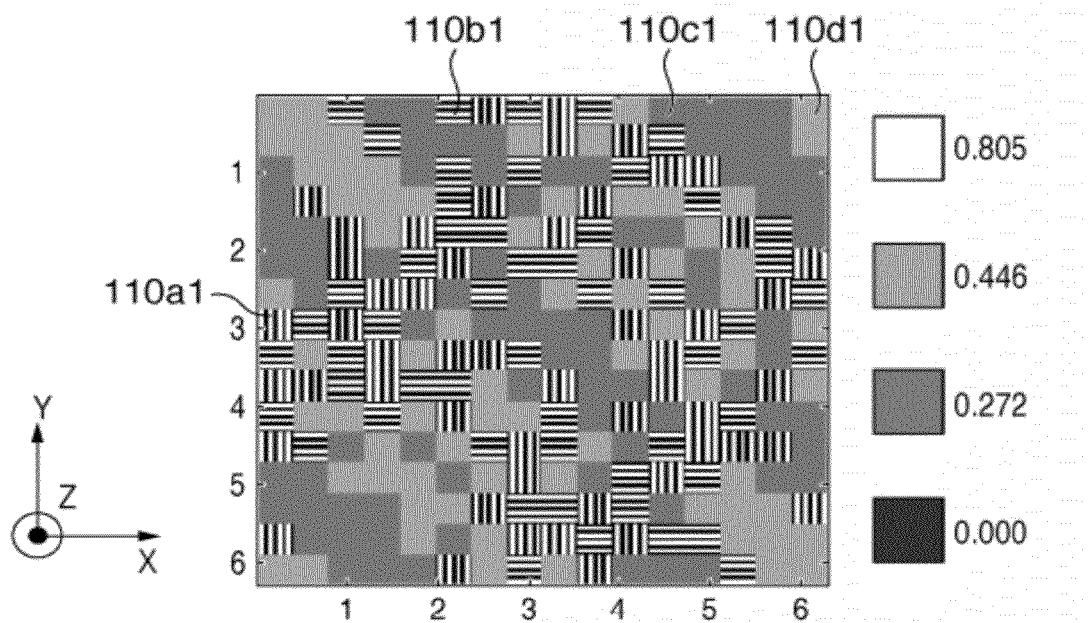
FIG. 13 is a chart showing the thickness of a computer generated hologram which integrates the computer generated hologram compatible with the X-polarized light target image, and that compatible with the Y-polarized light target image.

FIG. 13 is a chart showing the thickness of a computer generated hologram which integrates the computer generated hologram compatible with the X-polarized light target image (FIG. 12A), and that compatible with the Y-polarized light target image (FIG. 12B). Although the computer generated hologram shown in FIG. 13 has the cell structure shown in FIG. 7, it may have the cell structure shown in FIG. 2 or 6.

In FIG. 13, the density represents the thickness of each cell (in the Z direction). A color closer to white indicates a larger thickness, and that closer to black indicates a smaller thickness. The numerical values shown in FIG. 13 indicate the internal thicknesses of the first anisotropic cell 110$a$1 and second anisotropic cell 110$b$1, and the thicknesses of the first isotropic cell 110$c$1 and second isotropic cell 110$d$1 in the computer generated hologram 100 (unit: μm). Note that the numerical values shown in FIG. 13 exemplify a case in which the first anisotropic cell 110$a$1 and second anisotropic cell 110$b$1 are made of quartz having a refractive index of 1.56 with respect to a wavelength of 193 nm.

If linearly polarized light as shown in FIG. 3 impinges on the computer generated hologram shown in FIG. 13, this hologram can form a light intensity distribution $LI_5$ as shown in FIG. 9 (i.e., dipole illumination by S-polarized light). If all the polarization directions PD of the light intensity distribution $LI_5$ shown in FIG. 9 are the same as the polarization direction of the incident light, a computer generated hologram can be formed from isotropic media alone in the prior art. However, even in this case, the target image may be divided in two orthogonal polarization directions, and computer generated holograms compatible with the respective polarization directions may be integrated as in this embodiment. This makes it possible to reduce speckles of a light intensity distribution (reproduced image) formed by a computer generated hologram.

Figure 14:
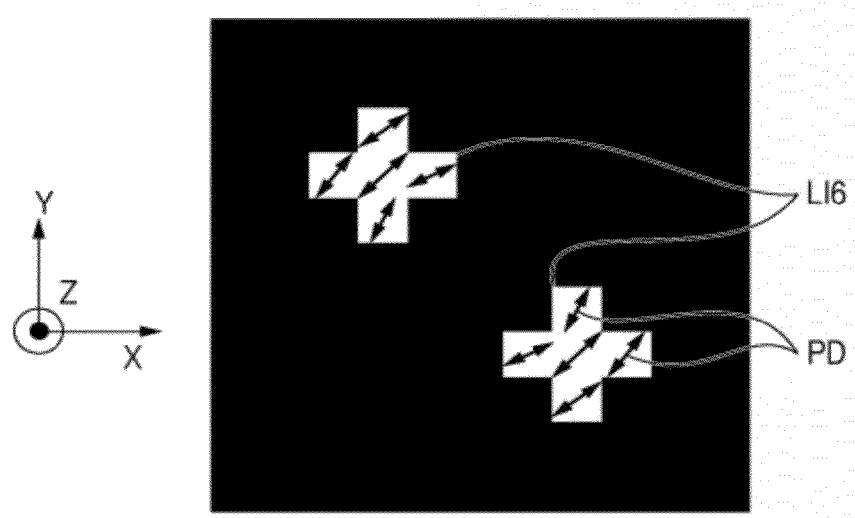
FIG. 14 is a view showing an example of a light intensity distribution (target image) formed by a computer generated hologram.

A design example of a computer generated hologram 100 which assumes a light intensity distribution $LI_6$ as shown in FIG. 14 as the target image will be explained. Polarization directions PD of the light intensity distribution $LI_6$ include a plurality of polarization directions, and match the circumferential direction of concentric circles (i.e., correspond to S-polarization) in each pixel. The method of generating data to manufacture a computer generated hologram 100 which forms a light intensity distribution including arbitrary polarization directions, shown in FIG. 8, is also applicable to the design of the computer generated hologram 100 which assumes the light intensity distribution $LI_6$ shown in FIG. 14 as the target image. Note that FIG. 14 is a view showing an example of a light intensity distribution (target image) formed by a computer generated hologram 100.

In step S1002, the polarization direction (polarization state) of light which impinges on the computer generated hologram 100 (incident light) is determined. In this embodiment, linearly polarized light in which the angle of the polarization direction with respect to the X-axis is −45° (see FIG. 3) is determined as the incident light, as described above. Hence, the target image shown in FIG. 14 is the one in which X-polarized light is π out of phase from Y-polarized light.

In step S1004, the target image is divided into X-polarized light (X-polarized light component) and Y-polarized light (Y-polarized light component). In other words, the target image is divided into an X-polarized light target image and Y-polarized light target image to determine the shapes of the X-polarized light target image and Y-polarized light target image (first determination step).

Figure 15A:
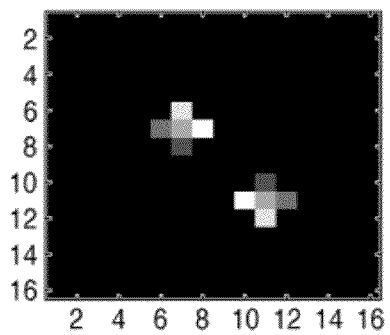
FIGS. 15A and 15B are charts showing the intensities of X-polarized light and Y-polarized light when the target image shown in FIG. 14 is divided into them.
Figure 15B:
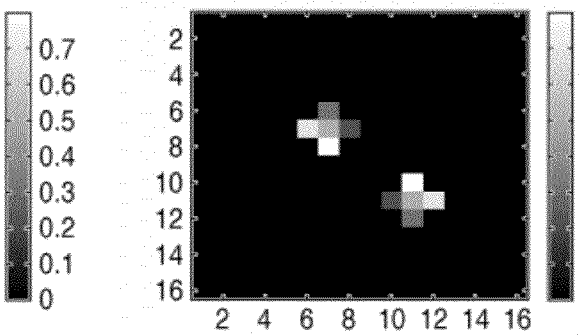

FIG. 15A shows, when the target image shown in FIG. 14 is divided into X-polarized light and Y-polarized light, the intensity (light intensity distribution) of the X-polarized light. FIG. 15B shows, when the target image shown in FIG. 14 is divided into X-polarized light and Y-polarized light, the intensity (light intensity distribution) of the Y-polarized light.

In step S1006, the phases of the two target images divided in step S1004 are determined in accordance with the relationship between the polarization direction of the incident light (see FIG. 3) and those of the target image (see FIG. 14) (second determination step). In this embodiment, the angles of the polarization directions of the target image with respect to the X-axis are 0° (exclusive) to 90° (exclusive). Hence, the target image shown in FIG. 14 is formed by a light intensity distribution $LI_6$ in a reverse phase region in which the polarization direction of the target image is perpendicular to that of the incident light or the polarization directions of the X-polarized light and Y-polarized light fall within an angle (acute angle) formed by the two polarization directions. To attain this configuration, the X-polarized light target image need only be set to be π out of phase from the Y-polarized light target image.

Figure 16A:
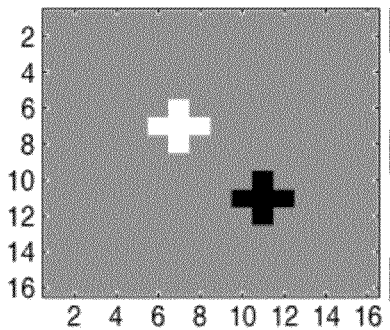
FIGS. 16A and 16B are charts showing an example of combinations of the phase of the X-polarized light target image shown in FIG. 15A and that of the Y-polarized light target image shown in FIG. 15B.
Figure 16B:
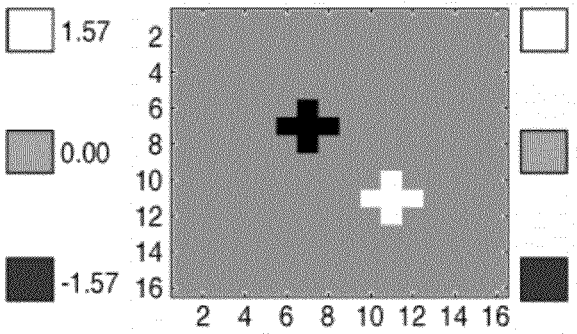

FIGS. 16A and 16B are charts showing an example of combinations of the phase of the X-polarized light target image shown in FIG. 15A and that of the Y-polarized light target image shown in FIG. 15B. Referring to FIGS. 16A and 16B, the phases of the X-polarized light target image and Y-polarized light target image are reversed at identical cell positions in reverse phase regions. FIGS. 16A and 16B merely show an example of phase combinations, which can be arbitrarily selected as long as the X-polarized light target image is π out of phase from the Y-polarized light target image in reverse phase regions.

In step S1008, first data which specifies a computer generated hologram compatible with the shape of the X-polarized light target image divided in step S1004 and the phase of the X-polarized light target image determined in step S1006 is generated. Likewise, in step S1010, second data which specifies a computer generated hologram compatible with the shape of the Y-polarized light target image divided in step S1004 and the phase of the Y-polarized light target image determined in step S1006 is generated.

Figure 17A:
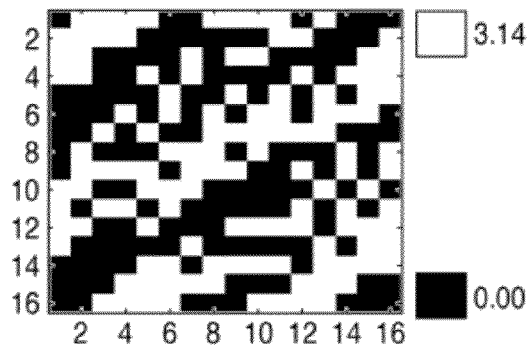
FIGS. 17A and 17B are charts showing the phase distribution of a computer generated hologram designed to be compatible with the X-polarized light target image and its phase, and that of a computer generated hologram designed to be compatible with the Y-polarized light target image and its phase.
Figure 17B:
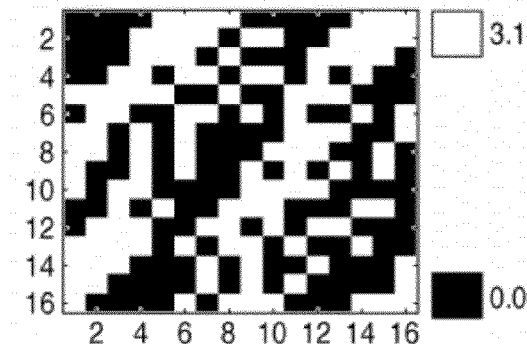

FIG. 17A is a chart showing the phase distribution (first data) of a computer generated hologram designed to be compatible with the X-polarized light target image (FIG. 15A) and its phase (FIG. 16A). FIG. 17B is a chart showing the phase distribution (second data) of a computer generated hologram designed to be compatible with the Y-polarized light target image (FIG. 15B) and its phase (FIG. 16B).

Figure 17B:
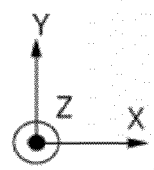

In step S1012, the first data (FIG. 17) generated in step S1008 and the second data (FIG. 17B) generated in step S1010 are integrated.

Figure 18:
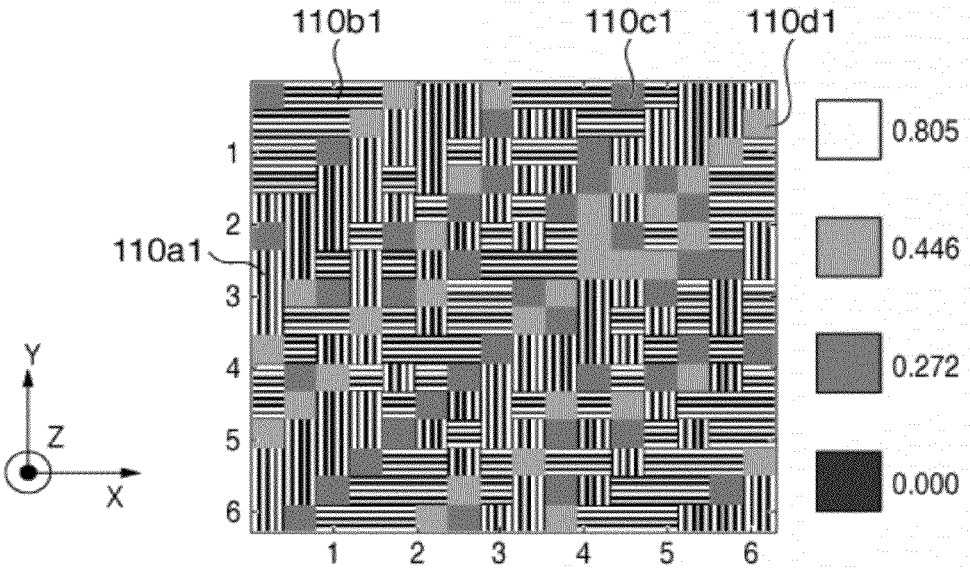
FIG. 18 is a chart showing the thickness of a computer generated hologram which integrates the computer generated hologram compatible with the X-polarized light target image, and that compatible with the Y-polarized light target image.

FIG. 18 is a chart showing the thickness of a computer generated hologram which integrates the computer generated hologram compatible with the X-polarized light target image (FIG. 17A), and that compatible with the Y-polarized light target image (FIG. 17B). Although the computer generated hologram shown in FIG. 18 has the cell structure shown in FIG. 7, it may have the cell structure shown in FIG. 2 or 6.

In FIG. 18, the density represents the thickness of each cell (in the Z direction). A color closer to white indicates a larger thickness, and that closer to black indicates a smaller thickness. The numerical values shown in FIG. 18 indicate the internal thicknesses of the first anisotropic cell 110$a$1 and second anisotropic cell 110$b$1, and the thicknesses of the first isotropic cell 110$c$1 and second isotropic cell 110$d$1 in the computer generated hologram 100 (unit: μm). Note that the numerical values shown in FIG. 18 exemplify a case in which the first anisotropic cell 110$a$1 and second anisotropic cell 110$b$1 are made of quartz having a refractive index of 1.56 with respect to a wavelength of 193 nm.

If linearly polarized light as shown in FIG. 3 impinges on the computer generated hologram shown in FIG. 18, this hologram can form a light intensity distribution $LI_6$ as shown in FIG. 14 (i.e., dipole illumination by S-polarized light).

Figure 19:
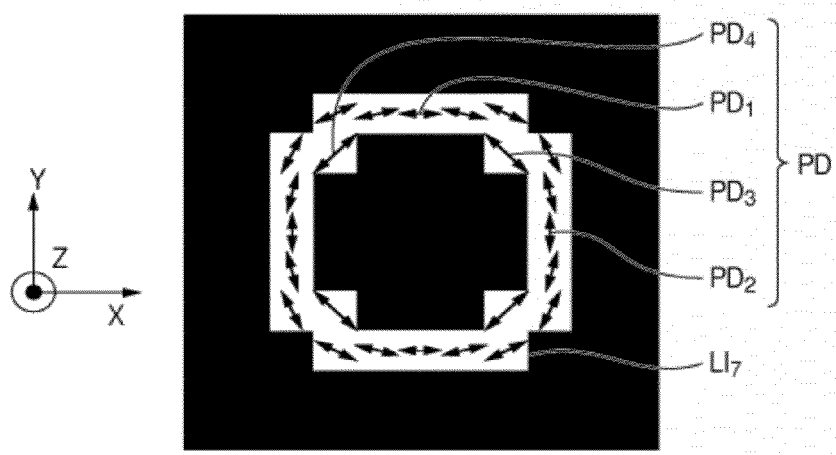
FIG. 19 is a view showing an example of a light intensity distribution (target image) formed by a computer generated hologram.

A design example of a computer generated hologram 100 which assumes a light intensity distribution $LI_7$ as shown in FIG. 19 as the target image will be explained. Polarization directions PD of the light intensity distribution $LI_7$ include a plurality of polarization directions $PD_1$ to $PD_4$, and match the circumferential direction of concentric circles (i.e., correspond to S-polarization) in each pixel. In this manner, the light intensity distribution $LI_7$ includes same phase regions and reverse phase regions. The method of generating data to manufacture a computer generated hologram 100 which forms a light intensity distribution including arbitrary polarization directions, shown in FIG. 8, is also applicable to the design of the computer generated hologram 100 which assumes the light intensity distribution $LI_7$ shown in FIG. 19 as the target image. Note that FIG. 19 is a view showing an example of a light intensity distribution (target image) formed by a computer generated hologram 100.

In step S1002, the polarization direction (polarization state) of light which impinges on the computer generated hologram 100 (incident light) is determined. In this embodiment, linearly polarized light in which the angle of the polarization direction with respect to the X-axis is −45° (see FIG. 3) is determined as the incident light, as described above.

In step S1004, the target image is divided into X-polarized light (X-polarized light component) and Y-polarized light (Y-polarized light component). In other words, the target image is divided into an X-polarized light target image and Y-polarized light target image to determine the shapes of the X-polarized light target image and Y-polarized light target image (first determination step).

Figure 20A:
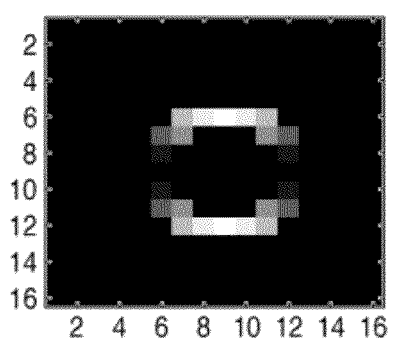
FIGS. 20A and 20B are charts showing the intensities of X-polarized light and Y-polarized light when the target image shown in FIG. 19 is divided into them.
Figure 20B:
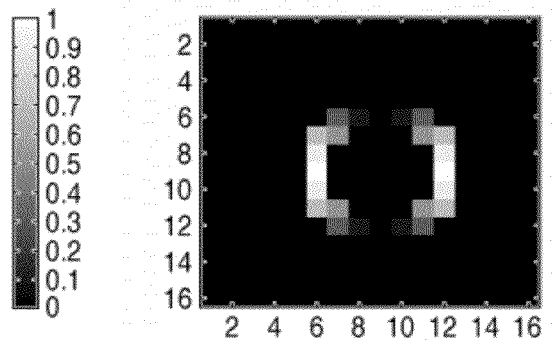
Figure 20B:
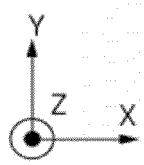

FIG. 20A shows, when the target image shown in FIG. 19 is divided into X-polarized light and Y-polarized light, the intensity (light intensity distribution) of the X-polarized light. FIG. 20B shows, when the target image shown in FIG. 19 is divided into X-polarized light and Y-polarized light, the intensity (light intensity distribution) of the Y-polarized light. If the target image does not include the polarization directions $PD_3$ and $PD_4$, data to manufacture a computer generated hologram compatible with the light intensity distributions shown in FIGS. 20A and 20B need only be generated. In this case, it is possible to use, for example, the iterative Fourier transform algorithm that is widely used to design computer generated holograms. Note that, because the target image shown in FIG. 19 includes the polarization directions $PD_3$ and $PD_4$, it is necessary to take account of not only the intensity (amplitude) of the target image but also its phase.

In step S1006, the phases of the two target images divided in step S1004 are determined in accordance with the relationship between the polarization direction of the incident light (see FIG. 3) and those of the target image (see FIG. 19) (second determination step). If the angle of a certain polarization direction of the target image with respect to the X-axis is −90° (exclusive) to 0° (exclusive) (e.g., the polarization direction $PD_3$), that is, this polarization direction matches a same phase region, the X-polarized light target image is set to be in phase with the Y-polarized light target image for this polarization direction. If the angle of a certain polarization direction of the target image with respect to the Y-axis is 0° (exclusive) to 90° (exclusive) (e.g., the polarization direction $PD_4$), that is, this polarization direction matches a reverse phase region, the X-polarized light target image is set to be π out of phase from the Y-polarized light target image for this polarization direction.

Figure 21A:
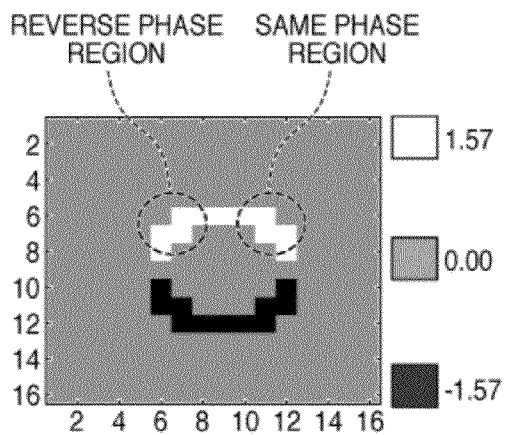
FIGS. 21A and 21B are charts showing an example of combinations of the phase of the X-polarized light target image shown in FIG. 20A and that of the Y-polarized light target image shown in FIG. 20B.
Figure 21B:
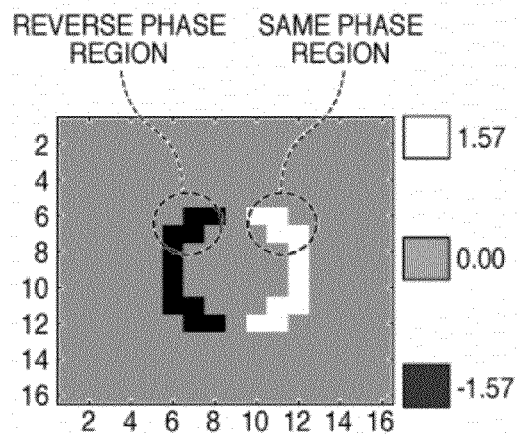
Figure 21B:
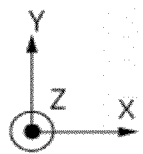

FIGS. 21A and 21B are charts showing an example of combinations of the phase of the X-polarized light target image shown in FIG. 20A and that of the Y-polarized light target image shown in FIG. 20B. FIGS. 21A and 21B merely show an example of phase combinations. Phase combinations can be arbitrarily selected as long as the X-polarized light target image is in phase with the Y-polarized light target image in same phase regions, and the X-polarized light target image is π out of phase from the Y-polarized light target image in reverse phase regions.

If the angle of a certain polarization direction of the target image with respect to the X-axis is 0° (e.g., the polarization direction $PD_1$) or 90° (−90°) (e.g., the polarization direction $PD_2$), the target image is formed by X-polarized light or Y-polarized light alone, so phases can be selected arbitrarily. Adjacent regions may be set to be in phase with each other in order to prevent the generation of speckles.

In step S1008, first data which specifies a computer generated hologram compatible with the shape of the X-polarized light target image divided in step S1004 and the phase of the X-polarized light target image determined in step S1006 is generated. Likewise, in step S1010, second data which specifies a computer generated hologram compatible with the shape of the Y-polarized light target image divided in step S1004 and the phase of the Y-polarized light target image determined in step S1006 is generated.

Figure 22A:
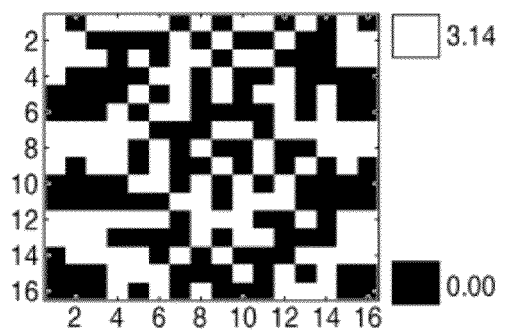
FIGS. 22A and 22B are charts showing the phase distribution of a computer generated hologram designed to be compatible with the X-polarized light target image and its phase, and that of a computer generated hologram designed to be compatible with the Y-polarized light target image and its phase.
Figure 22B:
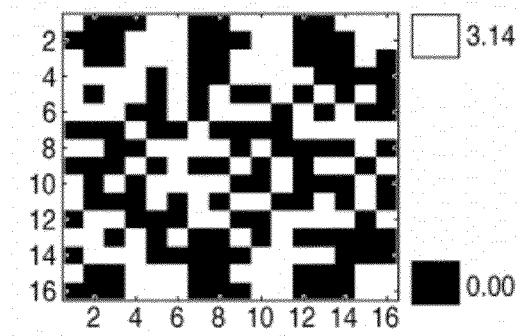
Figure 22B:
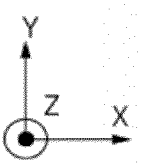

FIG. 22A is a chart showing the phase distribution (first data) of a computer generated hologram designed to be compatible with the X-polarized light target image (FIG. 20A) and its phase (FIG. 21A). FIG. 22B is a chart showing the phase distribution (second data) of a computer generated hologram designed to be compatible with the Y-polarized light target image (FIG. 20B) and its phase (FIG. 21B).

In step S1012, the first data (FIG. 22A) generated in step S1008 and the second data (FIG. 22B) generated in step S1010 are integrated.

Figure 23:
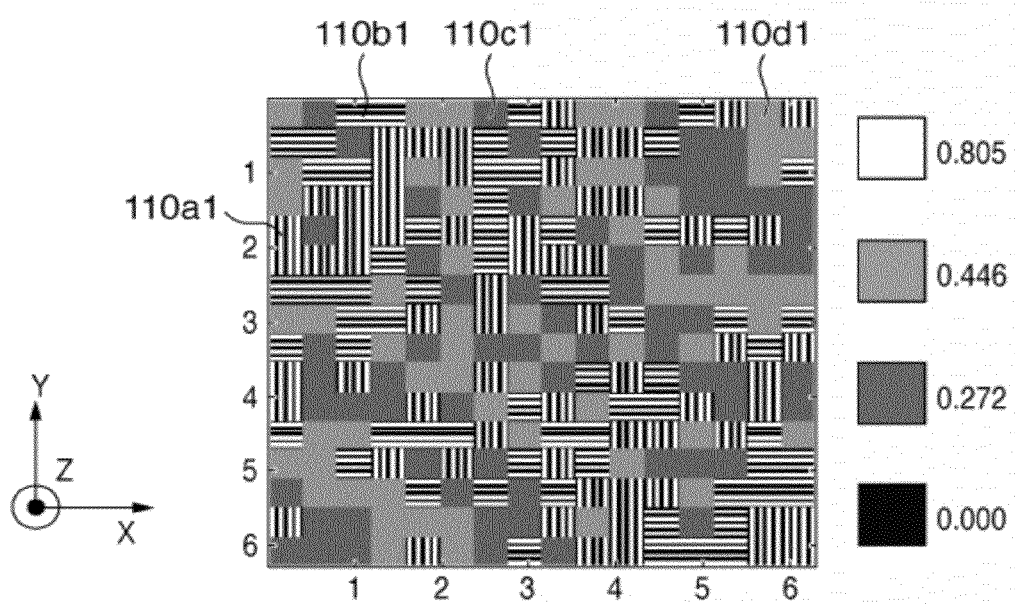
FIG. 23 is a chart showing the thickness of a computer generated hologram which integrates the computer generated hologram compatible with the X-polarized light target image, and that compatible with the Y-polarized light target image.

FIG. 23 is a chart showing the thickness of a computer generated hologram which integrates the computer generated hologram compatible with the X-polarized light target image (FIG. 22A), and that compatible with the Y-polarized light target image (FIG. 22B). Although the computer generated hologram shown in FIG. 23 has the cell structure shown in FIG. 7, it may have the cell structure shown in FIG. 2 or 6.

In FIG. 23, the density represents the thickness of each cell (in the Z direction). A color closer to white indicates a larger thickness, and that closer to black indicates a smaller thickness. The numerical values shown in FIG. 23 indicate the internal thicknesses of the first anisotropic cell 110$a$1 and second anisotropic cell 110$b$1, and the thicknesses of the first isotropic cell 110$c$1 and second isotropic cell 110$d$1 in the computer generated hologram 100 (unit: μm). Note that the numerical values shown in FIG. 23 exemplify a case in which the first anisotropic cell 110$a$1 and second anisotropic cell 110$b$1 are made of quartz having a refractive index of 1.56 with respect to a wavelength of 193 nm.

If linearly polarized light as shown in FIG. 3 impinges on the computer generated hologram shown in FIG. 23, this hologram can form a light intensity distribution $LI_7$ as shown in FIG. 19 (i.e., annular illumination by S-polarized light).

Also, if X-polarized light impinges on the computer generated hologram shown in FIG. 23, this hologram forms the light intensity distribution (target image) shown in FIG. 20A. If Y-polarized light impinges on the computer generated hologram shown in FIG. 23, this hologram forms the light intensity distribution (target image) shown in FIG. 20B. Hence, even when the design process of the computer generated hologram shown in FIG. 23 is unknown, the target image for each polarization direction can be specified by irradiating this hologram with X-polarized light or Y-polarized light. In addition, even when a computer generated hologram is not designed to be compatible with X-polarized light and Y-polarized light, the target image for each polarization direction can be specified by irradiating this hologram with linearly polarized light while continuously changing its polarization direction.

Because the prior arts require sub CGHs of types in a number equal to that of polarization directions of the target image, it is difficult for them to continuously change the polarization direction in each pixel. In contrast, this embodiment can provide a computer generated hologram which can continuously change the polarization direction in each pixel, as described above.

Although this embodiment has exemplified a case in which the computer generated hologram includes few cells, a light intensity distribution with a desired shape and polarization state can be formed even by increasing the number of cells of the computer generated hologram. Increasing the number of cells of the computer generated hologram makes it possible to decrease the sizes of pixels which divide the light intensity distribution (target image), thus forming a uniform light intensity distribution.

Figure 24:
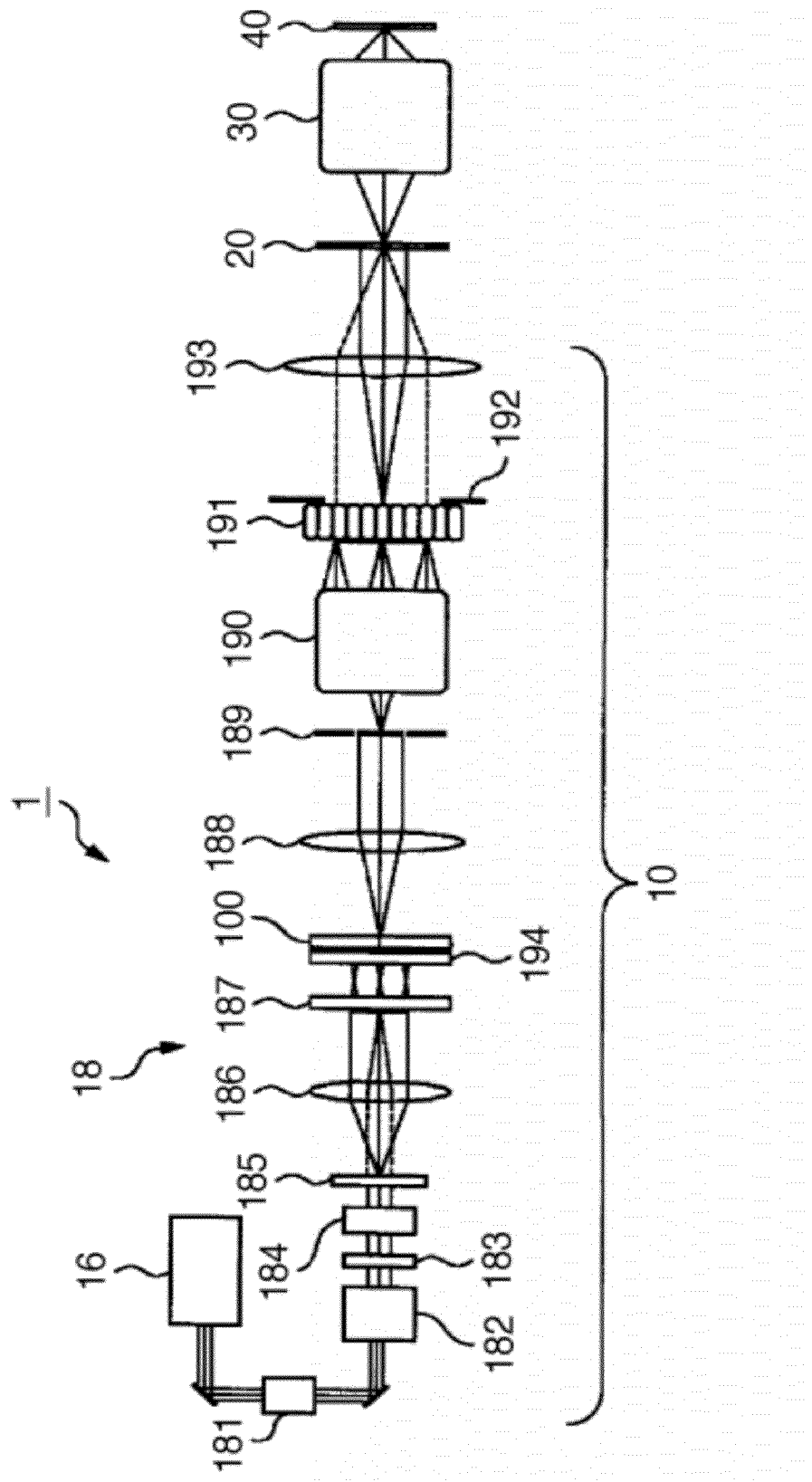
FIG. 24 is a view showing the arrangement of an exposure apparatus according to one aspect of the present invention.

An exposure apparatus 1 to which the computer generated hologram 100 according to the present invention is applied will be explained below with reference to FIG. 24. FIG. 24 is a view showing the arrangement of the exposure apparatus 1 according to one aspect of the present invention.

In this embodiment, the exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

As shown in FIG. 24, the exposure apparatus 1 includes an illumination apparatus 10, a reticle stage (not shown) for supporting the reticle 20, a projection optical system 30, and a wafer stage (not shown) for supporting the wafer 40.

The illumination apparatus 10 illuminates the reticle 20 on which a circuit pattern to be transferred is formed, and includes a light source 16 and illumination optical system 18.

The light source 16 is, for example, an excimer laser such as an ArF excimer laser with a wavelength of about 193 nm or a KrF excimer laser with a wavelength of about 248 nm. However, the light source 16 is not particularly limited to an excimer laser, and may be, for example, an $F_2$ laser with a wavelength of about 157 nm or a mercury lamp with a narrow wavelength range.

The illumination optical system 18 illuminates the reticle 20 with light from the light source 16, and performs modified illumination on the reticle 20 in a predetermined polarization state while ensuring a predetermined illuminance in this embodiment. In this embodiment, the illumination optical system 18 includes a light extension optical system 181, beam shaping optical system 182, polarization controller 183, phase controller 184, exit angle saving optical element 185, relay optical system 186, multibeam generation unit 187, polarization state adjusting unit 194, and computer generated hologram 100. The illumination optical system 18 also includes a relay optical system 188, aperture 189, zoom optical system 190, multibeam generation unit 191, aperture stop 192, and irradiation unit 193.

The light extension optical system 181 deflects light from the light source 16 to guide it to the beam shaping optical system 182. The beam shaping optical system 182 shapes the section of the light from the light source 16 into a desired shape by converting the horizontal to vertical ratio of the section of the light from the light source 16 into a desired value (e.g., by changing the sectional shape from a rectangle to a square). The beam shaping optical system 182 forms a light beam with a size and an angle of divergence which are required to illuminate the multibeam generation unit 187.

The polarization controller 183 includes, for example, a linear polarizer and has a function of removing unnecessary polarized light components. It is possible to efficiently convert light from the light source 16 into desired linearly polarized light by minimizing polarized light components removed (shielded) by the polarization controller 183.

The phase controller 184 converts the linearly polarized light obtained by the polarization controller 183 into circularly polarized light by giving a phase difference of λ/4 to it.

The exit angle saving optical element 185 includes, for example, an optical integrator (e.g., a fly-eye lens or fiber bundle including a plurality of microlenses), and outputs the light at a predetermined angle of divergence.

The relay optical system 186 converges the light which emerges from the exit angle saving optical element 185 on the multibeam generation unit 187. The relay optical system 186 adjusts the exit surface of the exit angle saving optical element 185 and the incident surface of the multibeam generation unit 187 to hold the Fourier transform relationship (the relationship between the object plane and the pupil plane or that between the pupil plane and the image plane).

The multibeam generation unit 187 includes an optical integrator (e.g., a fly-eye lens or fiber bundle including a plurality of microlenses) for uniformly illuminating the polarization state adjusting unit 194 and computer generated hologram 100. The exit surface of the multibeam generation unit 187 forms a light source surface including a plurality of point light sources. The light which emerges from the multibeam generation unit 187 impinges on the polarization state adjusting unit 194 as circularly polarized light.

The polarization state adjusting unit 194 converts the circularly polarized light obtained by the phase controller 184 into linearly polarized light having a desired polarization direction by giving a phase difference of λ/4 to it. The light which emerges from the polarization state adjusting unit 194 impinges on the computer generated hologram 100 as linearly polarized light.

The computer generated hologram 100 forms a light intensity distribution (e.g., a light intensity distribution LI including a plurality of polarization directions as shown in FIG. 1) at the position of the aperture 189 via the relay optical system 188. The computer generated hologram 100 can take any of the above-described forms, and a detailed description thereof will not be given herein.

The aperture 189 has a function of passing only a light intensity distribution formed by the computer generated hologram 100. The computer generated hologram 100 and aperture 189 are set to hold the Fourier transform relationship.

The zoom optical system 190 enlarges a light intensity distribution formed by the computer generated hologram 100 at a predetermined magnification, and projects it onto the multibeam generation unit 191.

The multibeam generation unit 191 is inserted on the pupil plane of the illumination optical system 18, and forms, on its exit surface, a light source image (effective light source distribution) corresponding to the light intensity distribution formed at the position of the aperture 189. In this embodiment, the multibeam generation unit 191 includes an optical integrator such as a fly-eye lens or cylindrical lens array. The aperture stop 192 is inserted near the exit surface of the multibeam generation unit 191.

The irradiation unit 193 includes, for example, a condenser optical system and illuminates the reticle 20 with an effective light source distribution formed on the exit surface of the multibeam generation unit 191.

The reticle 20 has a circuit pattern and is supported and driven by the reticle stage (not shown). Diffracted light generated by the reticle 20 is projected onto the wafer 40 via the projection optical system 30. Since the exposure apparatus 1 is of the step & scan scheme, it transfers the pattern of the reticle 20 onto the wafer 40 by scanning them.

The projection optical system 30 projects the pattern of the reticle 20 onto the wafer 40. The projection optical system 30 can be a dioptric system, catadioptric system, or catoptric system.

The wafer 40 is a substrate onto which the pattern of the reticle 20 is projected (transferred), and is supported and driven by the wafer stage (not shown). However, it is also possible to use a glass plate or another substrate in place of the wafer 40. The wafer 40 is coated with a resist.

As described above, the computer generated hologram 100 does not give a phase distribution to the wavefront of light polarized in a single direction, but two-dimensionally gives different phase distributions to the wavefronts of both X-polarized light and Y-polarized light. This makes it possible to form a light intensity distribution LI almost without generating any loss in light amount.

In exposure, light emitted by the light source 16 illuminates the reticle 20 by the illumination optical system 18. The light which bears the information of the pattern of the reticle 20 forms an image on the wafer 40 by the projection optical system 30. The illumination optical system 18 used for the exposure apparatus 1 can suppress any illumination variation and loss in light amount, and form a light intensity distribution with a desired shape and polarization state by the computer generated hologram 100. Hence, the exposure apparatus 1 can provide high-quality devices (e.g., a semiconductor device, an LCD device, an image sensing device (e.g., a CCD), and a thin-film magnetic head) with a high throughput and a good economical efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-341123 filed on Dec. 28, 2007, which is hereby incorporated by reference herein in its entirety.

The invention claimed is:

1. A computer generated hologram which forms a light intensity distribution on a predetermined plane by giving a phase distribution to a wavefront of incident light, said hologram comprising:
   a plurality of anisotropic cells each including an anisotropic medium configured to change a polarization state of the incident light; and
   a plurality of isotropic cells each including an isotropic medium configured not to change a polarization state of the incident light,
   wherein a linearly polarized light component, in a first direction, of the incident light forms a first light intensity distribution on the predetermined plane,
   a linearly polarized light component, in a second direction perpendicular to the first direction, of the incident light forms a second light intensity distribution different from the first light intensity distribution on the predetermined plane, and
   dimensions and arrangements of said plurality of anisotropic cells and said plurality of isotropic cells are set such that the linearly polarized light component in the first direction is in phase with or $\pi$ out of phase from the linearly polarized light component in the second direction in a region in which the first light intensity distribution and the second light intensity distribution are superposed on each other.

2. The hologram according to claim 1, wherein a difference between a refractive index of said isotropic medium with respect to the linearly polarized light component in the first direction and a refractive index of said isotropic medium with respect to the linearly polarized light component in the second direction is 0 (inclusive) to 0.001 (inclusive) for a wavelength of the incident light.

3. The hologram according to claim 1, wherein
   the incident light is linearly polarized light including the linearly polarized light component in the first direction and the linearly polarized light component in the second direction, and
   light which forms a light intensity distribution in the region in which the first light intensity distribution and the second light intensity distribution are superposed on each other is polarized light including the linearly polarized light component in the first direction and the linearly polarized light component in the second direction.

4. The hologram according to claim 3, wherein
   the region in which the first light intensity distribution and the second light intensity distribution are superposed on each other includes a same phase region in which the linearly polarized light component in the first direction is in phase with the linearly polarized light component in the second direction, and a reverse phase region in which the linearly polarized light component in the first direction is $\pi$ out of phase from the linearly polarized light component in the second direction, and
   a polarization direction of linearly polarized light which forms a light intensity distribution in the same phase region is different from a polarization direction of linearly polarized light which forms a light intensity distribution in the reverse phase region.

5. The hologram according to claim 4, wherein a polarization direction of the incident light is identical to the polarization direction of the linearly polarized light which forms the light intensity distribution in the same phase region, or the first direction and the second direction fall outside an acute angle formed by the polarization direction of the incident light and the polarization direction of the linearly polarized light which forms the light intensity distribution in the same phase region.

6. The hologram according to claim 4, wherein a polarization direction of the incident light is perpendicular to the polarization direction of the linearly polarized light which forms the light intensity distribution in the reverse phase region, or the first direction and the second direction fall within an acute angle formed by the polarization direction of the incident light and the polarization direction of the linearly polarized light which forms the light intensity distribution in the reverse phase region.

7. The hologram according to claim 1, wherein the incident light is linearly polarized light including the linearly polarized light component in the first direction and the linearly polarized light component in the second direction, which have an identical amplitude.

8. The hologram according to claim 1, wherein said anisotropic medium includes one of a birefringent material and a three-dimensional structure which generates form birefringence.

9. A generation method of generating data to manufacture a computer generated hologram which forms a light intensity distribution on a predetermined plane by giving a phase distribution to a wavefront of incident light, said method comprising:
   a first determination step of dividing a light intensity distribution to be formed on the predetermined plane into a first light intensity distribution including a linearly polarized light component in a first direction, and a second light intensity distribution including a linearly polarized light in a second direction perpendicular to the first direction, thereby determining shapes of the first light intensity distribution and the second light intensity distribution;
   a second determination step of determining phases of the first light intensity distribution and the second light intensity distribution in accordance with a relationship between a polarization direction of the incident light and a polarization direction of the light intensity distribution to be formed on the predetermined plane;
   a generation step of generating first data which specifies a computer generated hologram which forms the first light intensity distribution having the shape determined in the first determination step and the phase determined in the second determination step, and second data which specifies a computer generated hologram which forms the second light intensity distribution having the shape determined in the first determination step and the phase determined in the second determination step; and
   an integration step of integrating the first data and the second data generated in the generation step.

10. An exposure apparatus comprising:
    an illumination optical system configured to illuminate a reticle with light from a light source; and
    a projection optical system configured to project a pattern of the reticle onto a substrate,
    said illumination optical system including a computer generated hologram, wherein said computer generated hologram forms a light intensity distribution on a predetermined plane by giving a phase distribution to a wavefront of incident light, said computer generated hologram includes a plurality of anisotropic cells each including an anisotropic medium configured to change a polarization state of the incident light, and a plurality of isotropic cells each including an isotropic medium configured not to change a polarization state of the incident light, a linearly polarized light component, in a first direction, of the incident light forms a first light intensity distribution on the predetermined plane, a linearly polarized light component, in a second direction perpendicular to the first direction, of the incident light forms a second light intensity distribution different from the first light intensity distribution on the predetermined plane, and dimensions and arrangements of said plurality of anisotropic cells and said plurality of isotropic cells are set such that the linearly polarized light component in the first direction is in phase with or $\pi$ out of phase from the linearly polarized light component in the second direction in a region in which the first light intensity distribution and the second light intensity distribution are superposed on each other.

* * * * *